United States Patent
Reynolds et al.

(10) Patent No.: US 7,333,257 B2
(45) Date of Patent: Feb. 19, 2008

(54) DEVICE FOR CONTACTING PATTERNED ELECTRODES ON POROUS SUBSTRATES

(75) Inventors: John R. Reynolds, Gainesville, FL (US); Avni A. Argun, Gainesville, FL (US); Pierre Henri Aubert, Port sur Saone (FR); Mathieu Berard, St. Mathurin sur Loire (FR)

(73) Assignee: University of Florida Research Foundation, Inc., Gainesville, FL (US)

( * ) Notice: Subject to any disclaimer, the term of this patent is extended or adjusted under 35 U.S.C. 154(b) by 197 days.

(21) Appl. No.: 10/992,827

(22) Filed: Nov. 19, 2004

(65) Prior Publication Data

US 2005/0210672 A1    Sep. 29, 2005

Related U.S. Application Data

(60) Provisional application No. 60/523,247, filed on Nov. 19, 2003.

(51) Int. Cl.
 *G02F 1/153* (2006.01)
(52) U.S. Cl. ............ 359/265; 359/266; 359/269; 359/271; 359/273
(58) Field of Classification Search ............ 359/265, 359/266, 269, 273, 271; 345/49, 105; 348/817
See application file for complete search history.

(56) References Cited

U.S. PATENT DOCUMENTS 4,409,724 A * 10/1983 Tasch et al. ............ 438/30

| 5,995,273 | A | * | 11/1999 | Chandrasekhar | ............ 359/270 |
|---|---|---|---|---|---|
| 6,465,742 | B1 | | 10/2002 | Hiraoka et al. | |
| 6,660,188 | B1 | * | 12/2003 | Ohata et al. | ............ 252/500 |
| 2002/0010261 | A1 | * | 1/2002 | Callahan et al. | ............ 524/832 |
| 2002/0128515 | A1 | | 9/2002 | Ishida et al. | |
| 2002/0196518 | A1 | * | 12/2002 | Xu et al. | ............ 359/245 |
| 2003/0174377 | A1 | | 9/2003 | Reynolds et al. | |

FOREIGN PATENT DOCUMENTS

| EP | 0 863 550 A2 | 9/1998 |
|---|---|---|
| JP | 55 084916 A | 6/1980 |
| JP | 61 145536 A | 7/1986 |
| JP | 04 101424 A | 4/1992 |
| JP | 05 047219 A | 2/1993 |
| WO | WO 03/042753 A1 | 5/2003 |

* cited by examiner

*Primary Examiner*—Hung X. Dang
*Assistant Examiner*—Joseph Martinez
(74) *Attorney, Agent, or Firm*—Akerman Senterfitt

(57) ABSTRACT

A method for contacting patterned electrode devices includes the steps of providing a porous substrate, depositing electrically conductive material to form at least one electrode on a front-side of the porous substrate and depositing at least one electrically conductive back-side contact trace on the back-side of the substrate. A portion of the electrically conductive material penetrates into the substrate. A device is formed including the electrode on the front side of the substrate, wherein the electrode is electrically coupled by a conducting channel including the electrically conductive material through the substrate to the back-side contact trace.

22 Claims, 15 Drawing Sheets

(a)          (b)

(a)

(b)　　　(c)　　　(d)　　　(e)

(a)

(b)

DEVICE FOR CONTACTING PATTERNED ELECTRODES ON POROUS SUBSTRATES

CROSS-REFERENCE TO RELATED APPLICATIONS

This application claims the benefit of U.S. Provisional Application No. 60/523,247 entitled "A METHOD TO CONTACT PATTERNED ELECTRODES ON POROUS SUBSTRATES AND DEVICES THEREBY" filed on Nov. 19, 2003, the entirety of which is incorporated herein by reference.

STATEMENT REGARDING FEDERALLY SPONSORED RESEARCH OR DEVELOPMENT

The United States Government has rights in this invention pursuant to Air Force Office of Scientific Research Grant/Contracts # F49620-00-1-0047 and F49620-03-1-0091 Army Research Office/MURI (subcontract from UCLA) Grant/Contract # 0160-G-AC859.

FIELD OF THE INVENTION

The invention relates to methods of electrically contacting electromagnetically active devices from the back-side of porous substrates, and related devices.

BACKGROUND OF THE INVENTION

Electrical contact to electromagnetically active devices, such as integrated electronics, electroluminescent, photovoltaic, electrochromic, and other devices, is typically provided using electrically conductive traces which connect electrodes to conductive structures such as bond pads, all such structures disposed on the same side of the device. The conductive traces and bond pads can significantly diminish the available area for active devices. Moreover, such arrangements can introduce performance limitations, as well as affect the appearance of the device for display applications, such as for certain electrochromic and electroluminescent devices.

SUMMARY OF THE INVENTION

A method for contacting patterned electrode devices includes the steps of providing a porous substrate, depositing electrically conductive material on a front-side of the porous substrate, wherein a portion of the electrically conductive material penetrates into the porous substrate, and forming at least one electrode from the electrically conductive material. The depositing and forming steps can be a single step, such as through the use of shadow masks. At least one electrically conductive back-side contact trace is deposited on the back-side of the substrate. A device is formed including the electrode on the front-side of the substrate, wherein the electrode on the front-side of the substrate is electrically coupled by a conducting channel including the electrically conductive material through the porous substrate to the back-side contact trace.

For simplicity, the first side is generally referred to herein as the front-side, and the other side as the back-side. In display-related applications, the electrode comprising front-side will generally face up and the porous substrate will be optically opaque to hide the back-side conducting traces. However, the invention can also use optically transparent substrates in certain applications. Moreover, the side referred to the back-side may be oriented facing up, or sideways in certain applications, while the side referred to as the front-side can be oriented facing down or sideways.

The front-side electrically conductive material can directly electrically couple to the back-side contact trace through a conducting channel. The method can also include the step of adding an electrically conductive solution and drying the solution to complete the conducting channel. In this embodiment, the solution can comprise an electrically conductive polymer or electrically conductive organic solution. The solution can be an aqueous solution, wherein the conductive polymer can diffuse into the substrate and form a conducting bridge between the electrically conductive material and the electrically conductive trace. The adding step can comprise ink jet printing to print the electrically conductive solution. The solution can comprise a fluid metal which forms the conducting channel.

The depositing step can comprise a variety of processes, including but not limited to evaporation, chemical vapor deposition, plasma assisted chemical vapor deposition, sputter deposition, and ion beam assisted vapor deposition. The electrode can be a porous electrode. The device can be an electrochromic device, with the method further comprising the step of coating an electrochromically active polymer layer on the electrode. The coating step can comprise can comprise electrochemical coating, or solution coating methods, such as inkjet printing, spray coating through masks or spin coating.

An electromagnetically active device comprises a porous substrate, at least on electrode formed from electrically conductive material disposed on a top-side of the substrate, wherein a portion of said conductive material penetrates into the substrate. At least one back-side contact trace is disposed on the back-side of the substrate, wherein the electrode is electrically coupled by a conducting channel including the electrically conductive material through the substrate to the back-side contact trace. An electromagnetically active layer is electrically coupled to the electrode.

The device can comprise an electrochromic device (ECD), wherein the electromagnetically active layer comprises an electrochromically active layer. The ECD can comprise an electrolyte layer disposed between the back-side trace and the electrochemically active layer. An electrically conductive contact layer is disposed in contact with the electrochemically active layer. In one embodiment, the at least one electrode can comprise a plurality of electrodes, the electrochromically active layer comprising a cathodically coloring polymer, an anodically coloring polymer, or an anodically coloring polymer on some of the plurality of electrodes and a cathodically coloring polymer on others of the plurality of electrodes.

The cathodically coloring polymer can provide a band gap ($E_g$)< or =2.0 eV in its neutral state. For example, the cathodically coloring polymer can comprise a poly(3,4-alkylenedioxyheterocycle), such as alkylenedioxypyrrole, alkylenedioxythiophene or alkylenedioxyfuran. The poly(3,4-alkylenedioxyheterocycle) can comprise a bridge-alkyl substituted poly(3,4-alkylenedioxythiophene), such as PProDOT-(methyl)$_2$, PProDOT-(hexyl)$_2$, or PProDOT-(ethylhexyl)$_2$.

The anodically coloring polymer can provide a band gap ($E_g$)>3.0 eV in its neutral state, such as a poly(3,4-alkylenedioxyheterocycle). The alkylenedioxyheterocycle can be an alkylenedioxypyrrole, alkylenedioxythiophene or alkylenedioxyfuran. The poly(3,4-alkylenedioxyheterocycle) can comprise an N-alkyl substituted poly(3,4-alkylenedioxypyrrole), such as N-Pr PProDOP, N-Gly PProDOP or N-propane sulfonated PProDOP (PProDOP-NPrS). The ECD can switch between an optically clear and a colored state in less than one second.

BRIEF DESCRIPTION OF THE DRAWINGS

A fuller understanding of the present invention and the features and benefits thereof will be accomplished upon review of the following detailed description together with the accompanying drawings, in which:

FIG. 8(a) shows a scanned photograph of a numerical display ECD shown along with its back-side contacts. Pixels are independently addressed and their contacts to the voltage source were all made using back-side contacts, while FIGS. 8(b)-(e) show a numerical display ECD benefiting from the high contrast of PProDOT-(Me)$_2$ on gold showing the numbers: "2", "4", "5", and "8", respectively.

FIG. 9(a) shows the total reflectance (% R) of an electrochromic device having a porous electrode and porous substrate according to the invention from the visible region (400-800 nm) to the NIR region (800-1600 nm) in two extreme redox states; FIG. 9(b) is a scanned photograph of the active polymer layer for the electrochromic device shown in FIG. 9(a) in its fully reduced or neutral state, while FIG. 9(c) is a scanned photograph of the active polymer layer in a highly transmissive state in the visible region which allows the gold electrode layer on the back-side to be seen.

FIG. 11(a) shows the spectroelectrochemistry of an ECD built on a porous substrate (without back-side contact) based on the polymer PProDOT-Me$_2$, while

DETAILED DESCRIPTION

A method for contacting patterned electrode devices includes the steps of providing a porous substrate, depositing electrically conductive material to form at least one electrode on a front-side of the porous substrate, and depositing at least one electrically conductive trace on the back-side of the substrate. A portion of the conductive material from the front-side deposition processing penetrates into the porous substrate. A device is then formed on the substrate which utilizes the electrode(s) provided, wherein the electrode is electrically coupled by a conducting channel including the electrically conductive material through the substrate to the electrically conductive traces on the back-side of the substrate.

The invention can be used for a wide variety of electromagnetically active devices which require electrically conducting electrodes to operate, such as electrochromic, electroluminescent, photovoltaic, as well as other electrochemical and electronic devices. Electronic devices can include semiconductor devices. The invention can also be used to form mixed devices, such as electrochromic devices including field effect transistors (FET), or light-emitting diodes (LEDs) powered through FET switches.

As defined herein, the phrases "porous substrate" or "porous electrode" refers to a material whose surface allows penetration by a liquid. Conducting channels can be created according to the invention by filling the pores by introducing either gaseous, liquid or solid state electrically conductive materials. Some porous substrates can have well defined pore sizes which can span the thickness of the substrate. This first type of porous substrate can be an ion track etched polycarbonate membrane having well-defined pore sizes, such as fairly constant 10 µm diameter pores. Alternatively, porous substrates can be fiber-like substrates which have generally poorly defined pores which do not extend through the thickness of the substrate material. Examples of fiber-like substrates include polypropylene prefilters, nylon/polytetrafluoroethylene membranes, laboratory filter paper, or perfluorinated fibrous membrane-based materials.

Figure 1:
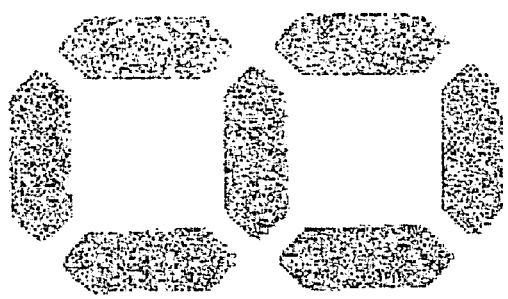
FIG. 1(a) is a scanned photograph of an exemplary front-side metal deposition mask.
FIG. 1(b) is a scanned photograph of an exemplary back-side metal deposition mask.
FIG. 1(c) is a scanned photograph of the front-side of an optically transparent porous polycarbonate substrate showing a front-side metal pattern produced using the mask shown in FIG. 1(a) and a back-side metal pattern using the mask shown in FIG. 1(b).
FIG. 1(d) is a scanned photograph of the front-side of opaque laboratory filter paper patterned with gold on the back showing the pattern produced using the mask shown in FIG. 1(a).
Figure 1:
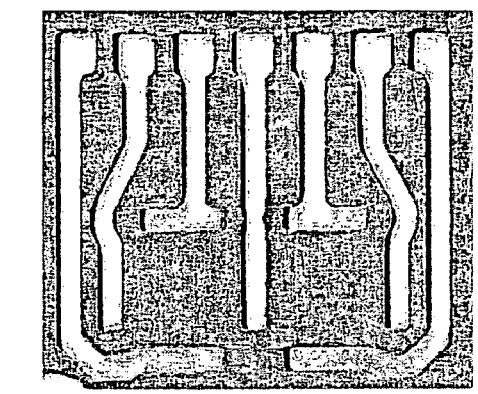
Figure 1:
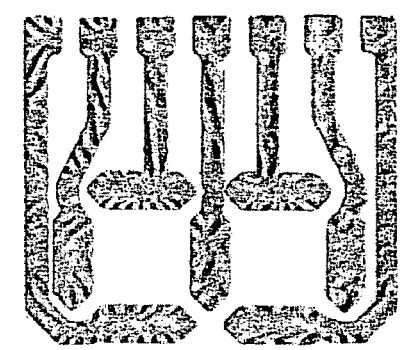
Figure 1:
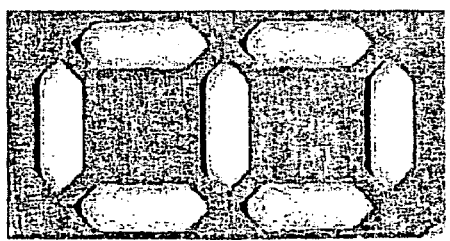

The porous substrate can be patterned with metal using various techniques known in the art, including lithographic techniques. One simple method for patterning metal on porous substrates is using machine cut shutter masks. One mask, such as shown in FIG. 1(a), can be used to pattern the active (front) side which includes the desired electrode pattern, while a second mask, such as shown in FIG. 1(b), can be used to pattern electrically conductive traces on the back-side of the porous substrate. The masks selectively shield portions of the porous substrate surface during the metal deposition process. A suitable metal which can be readily evaporated at a reasonably low temperature, such as gold, can be applied using an evaporation process, such as metal vapor deposition (MVD) under high vacuum ($<10^{-4}$ torr, or better). The metal can be deposited on both sides of the porous substrate simultaneously in a single step, or in two separate steps.

FIG. 1(c) is a photograph of the front-side of a porous polycarbonate substrate having a front-side metal pattern applied using the mask shown in FIG. 1(a). This step allows the deposition of a plurality of independent electrodes onto the surface of the porous substrate. The back-side metal pattern is also visible in FIG. 1(c) due to significant substrate optical transparency. FIG. 1(d) is a photograph of the front-side of opaque laboratory filter paper patterned with gold on the front showing the pattern produced using the mask shown in FIG. 1(a). The back-side conductive traces in FIG. 1(d) are hid by the opaque substrate.

Figure 2:
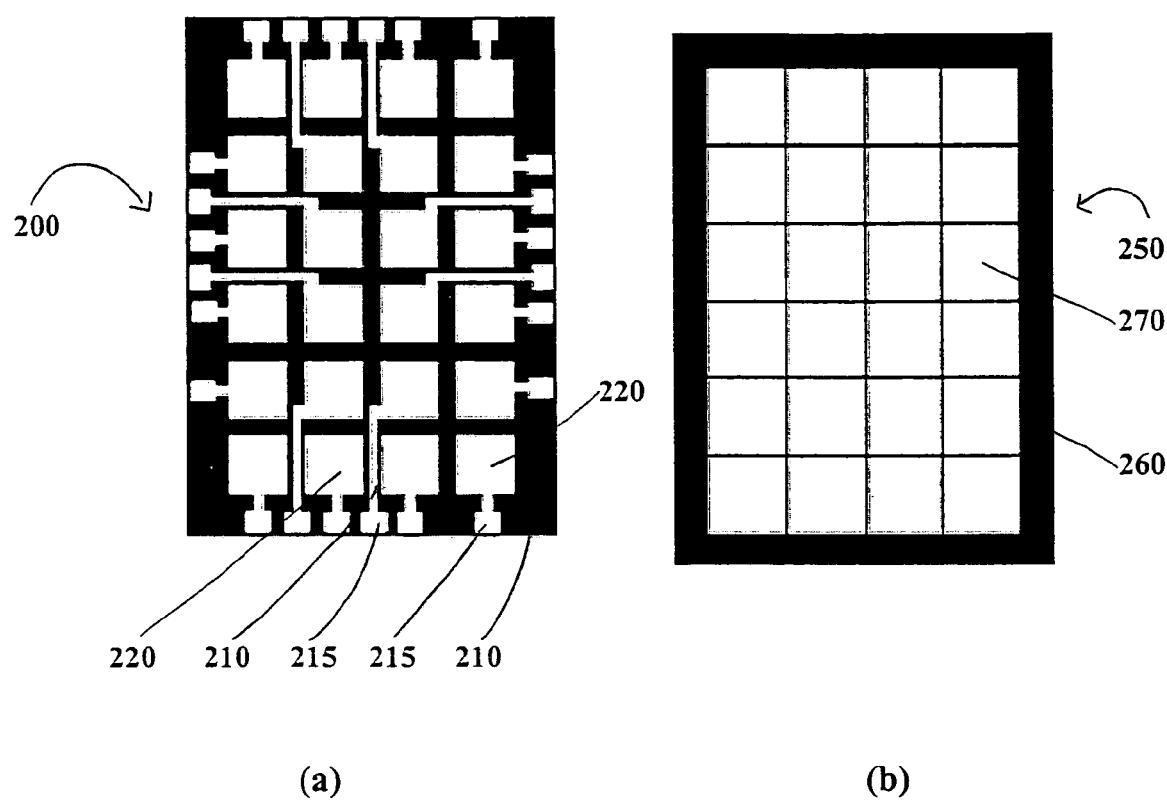
FIG. 2(a) shows a prior art 24 pixel panel display electrode with visible front contacts and bond pads provided for each pixel.
FIG. 2(b) shows a 24 pixel panel display electrode without visible contacts, according to an embodiment of the invention. The white areas represent the metallized regions and the black areas represent the electrically insulating regions.

FIG. 2(a) shows a prior art 24 pixel panel electrochromic or other display electrode 200 with visible front contact traces 210 and bond pads 215 for each pixel 220. FIG. 2(b) shows a 24 pixel panel electrochromic display 250 having patterned electrodes 270 (white areas) but no visible contacts, according to an embodiment of the invention. An opaque porous substrate was used. Black areas 260 represent electrically insulated regions. The invention thus allows the appearance of contact lines and bond pads on pixelated electrode surfaces to be removed. Moreover, the invention clearly simplifies making contact to a patterned electrode by accessing the electrodes from behind.

Figure 3:
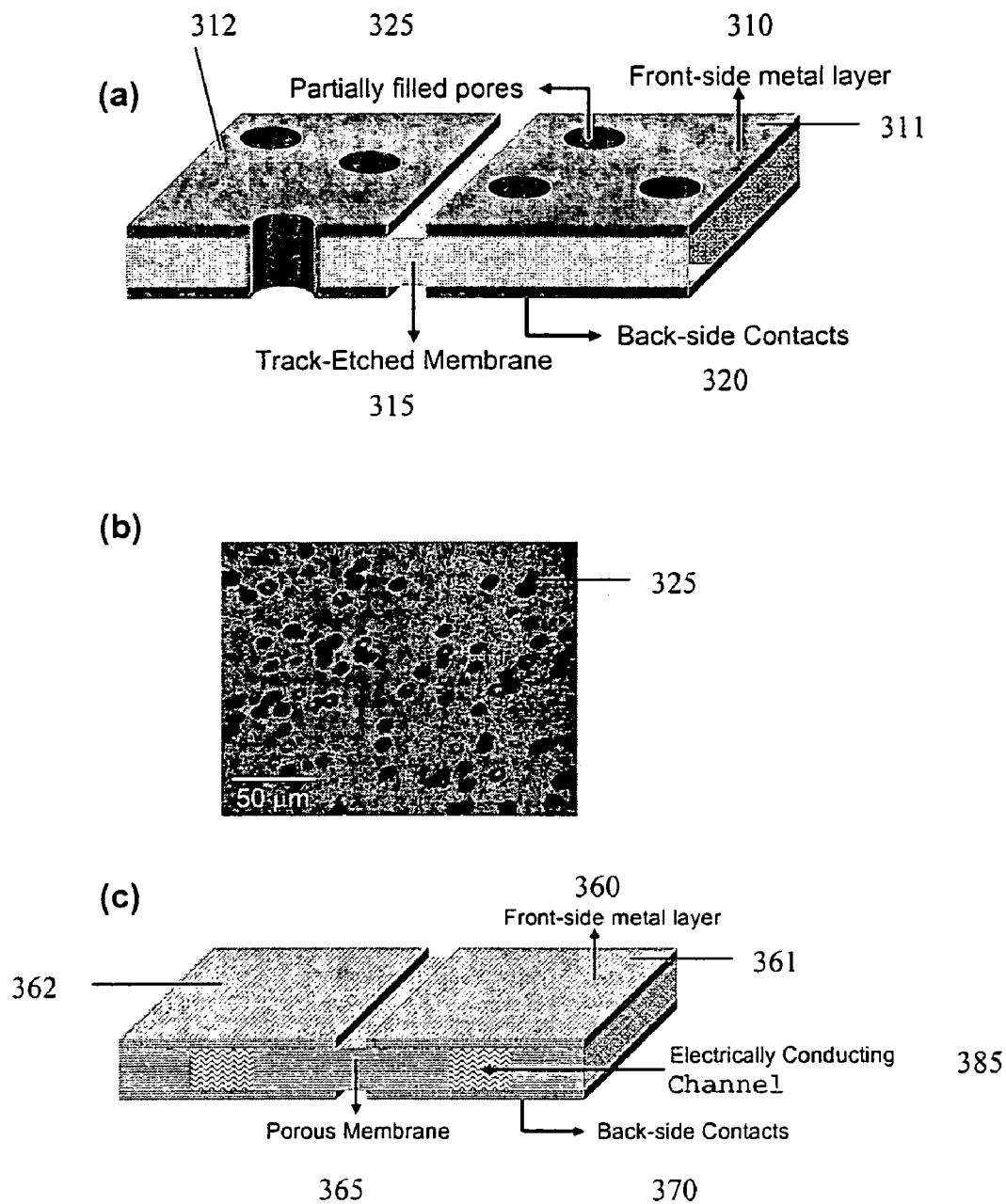
FIG. 3(a) shows a schematic representation of an ion track etched membrane substrate with a well-defined pore size where a metal is deposited on both front and back sides of the membrane. Electrical conductivity between the front and back sides is provided via the pores.
FIG. 3(b) is a scanned reflective optical micrograph of a double-side gold coated membrane substrate where black holes represent the unfilled pores.
FIG. 3(c) shows a schematic representation of a back-side contact using a fiber-like porous substrate. Electrical conductivity between the top and bottom gold layers is induced using a conducting material processed from solution or melt.

When a porous substrate having uniform pore sizes is used, a typical MVD metal deposition process using gold generally results in partial filling of the substrate pores with gold clusters for a gold thickness of less than about 50 to 100 nm. FIG. 3(a) illustrates a front-side metal layer 310 comprising electrodes 311 and 312 disposed on a track-etched membrane substrate 315 having well-defined pore sizes (e.g. 10 µm) and a nominal pore density of about $10^5$ pores/cm$^2$ (7.6% porosity), where the contacts 320 to address the electrodes 311 and 312 are hidden on the back of the substrate 315. The pores 325 within the substrate 315 are generally not clogged during the deposition process because the gold thickness (~60 nm) is small compared to the 10 µm pore size. In this arrangement, the front face is the active side which includes the desired pattern and the back side includes the contacts 320 to address the patterned regions 311 and 312.

Even though the substrate pores 325 are generally only partially filled, high electrical conductivity is still generally achieved because the metal deposition process (e.g. 50 to 100 nm) generally provides open conducting channels which extend through the entire thickness of the porous substrate 315. For example, the resistance between a front electrode 311 or 312 and the back contact 320 through the porous substrate 315 can be $10^{-4}$ ohms at 25° C. for a substrate thickness of about 100 µm and an area of about 1 cm$^2$. The series resistance from contacting the front-side electrodes from the back-side of the substrate 315 is thus generally negligible as compared to conventional front-side contacts.

It has been also found that for a gold thickness of about 50 nm or less the gold (or other) layer over planar regions of the porous substrate are generally porous. Porous electrode layers can be an advantage as they facilitate subsequent processing to be applied to regions underlying the gold or other porous electrode layer through the gold or other porous electrode layer.

FIG. 3(b) demonstrates partially filled pores 325 using a scanned reflective optical micrograph of a membrane after a 50 nm gold metallization process. The black dots indicate unfilled pores. Partially filled pores with gold appear to have a white center. This FIG. clearly shows that the majority of pores (black holes) remain partially filled after metallization and are thus preserved.

FIG. 3(c) shows an example of a front-side metal layer 360 comprising electrodes. 361 and 362 disposed on a fiber-like membrane substrate 365, such as based on prefilters or laboratory filter papers. As before, the contacts 370 to address the electrodes 361 and 362 are hidden on the back of the substrate 365 and the front face is the active side which includes the desired pattern. The back side includes the contacts 370 to address the patterned regions 361 and 362.

Fiber-like membrane substrates 365 are porous without well-defined pores. Metal deposition on both sides of this type of substrate results in electrically insulated front and back sides where the metal penetrates a minimal amount into the membrane substrate 365. Electrical conductivity can be induced at desired areas by introducing a solution or melt processable conductor into the porous substrate 365 to form an electrically conducting channel 385 to electrically couple metal layers 361, 362 to back-side contacts 370 as shown in FIG. 3(c). In one example, a commercially available, highly electrically conducting, and solution processable polymer dispersion, such as poly(3,4-ethylenedioxythiopene)/poly (styrene sulfonate) (PEDOT/PSS) can be used to electrically bridge the front-side metal layer 360 and back side contacts 370 of substrate 365. The aqueous solution of this and other electrically conducting polymer can diffuse into the porous membrane substrate 365 and form a conducting network between two sides after drying, such as 100 to 120° C. for one hour. Some lateral spreading is expected, but can be minimized by optimizing the surface energy of the substrate for well-adhesion and by optimizing the curing/drying conditions of the conducting polymer solution.

Once dried, PEDOT/PSS for example, is no longer soluble in common solvents and does not return to the non-conducting form at ambient conditions. The region specific conducting polymer bridges can be applied prior to or after the metal deposition. Other solution processing methods such as ink-jet printing and spray printing (such as through shadow masks) can also be considered to apply PEDOT/PSS or other highly electrically conducting, and solution processable polymer dispersions onto porous membrane substrates.

In a related embodiment, a solution comprising a fluid metal, such as an electrically conducting thermoplastic composition (e.g. a calomel paste) or a metallic silver paste can be used. In another embodiment, a low melting temperature metal, such as Hg which is a liquid at standard conditions, can be used. In some cases, the low melting temperature metal or other solution can be heated to obtain or enhance fluidity.

One particularly advantageous application for the invention relates to electrochromics. Electrochromic (EC) materials exhibit a reversible change in their electronic absorption properties, most notably exhibiting distinct color changes, upon reduction and/or oxidation. The emergence of electroactive and conducting polymers (EAPs) where the bandgap can be tuned through the full visible spectrum provides new opportunities for the design of materials for electrochromic devices (ECDs). Polymeric EC materials are promising candidates for applications including information displays and advertising, switchable windows, and thermal mirrors.

Some of the named inventors have developed a number of EC polymers based on polymers including polythiophenes and polypyrroles, with band gaps ranging from about 1.0 eV (1200 nm) to over 3.0 eV (400 nm). Some of these polymers are disclosed in U.S. Pat. No. 6,791,738 issued to Reynolds et al. on Sep. 14, 2004 entitled "Electrochromic Polymers and Polymer Electrochromic Devices", which is hereby incorporated by reference into the current application in its entirety. The same subject matter is also disclosed in related PCT/US02/37524, which published on Jun. 5, 2003 under International Publication No. WO03/046106.

Poly(3,4-alkylenedioxythiophene)s (PXDOTs) and poly (3,4-alkylenedioxypyrrole)s (PXDOPs) and their derivatives exhibit promising electrochromic properties due to their electron rich nature which give them especially low redox switching potentials. These polymers thus allow electrochemically stable transmissive/absorptive ECDs that exhibit fast switching times and high contrast ratios in the visible and NIR range. Bandgap control is an important in the construction of dual-polymer based ECDs in which a low bandgap (cathodically coloring) polymer is matched with a high bandgap (anodically coloring) polymer in order to obtain a high degree of contrast during the switching process.

The invention permits a significant improvement to both the appearance and density of reflective ECDs by allowing back-side contact to patterned working electrodes (WE's) on porous metallized substrates. FIGS. 4(a) and (b) show an exemplary dual polymer reflective ECD 400 based on the back-side contact method, in the reduced and oxidized state, respectively. FIG. 4(b) also shows a representation of the mechanism which allows the transition from the reduced state to the oxidized state.

Dual polymer reflective ECD 400 includes a porous membrane substrate 420 having a front-side metal layer 425 thereon which provides a plurality of electrodes (not shown) and electrically conductive back contact layer 418 (having conducting traces (not shown) analogous to those printed using the mask shown in FIG. 1(b)) on the back-side of the porous substrate 420. An electrochemically active "counter electrode (CE)" layer 410, such as PEDOT, is disposed on a Au layer 405 which coats a support layer 402. Support layer 402 can be a plastic.

A porous separator/gel electrolyte layer 415 is disposed between counter electrode 410 and back-side contact traces 418. Porous separator 415 is shown as three (3) layers in FIG. 4 because the gel electrolyte is applied to both the top and the bottom of the porous separator. The active working electrode layer 430, such as comprising a plurality of discrete regions, are disposed on the plurality of electrodes (not shown) provided by front-side metal layer 425. The working electrode layer 430 is generally polymeric and can comprise a dimethyl derivative of poly(3,4-propylenedioxythiophene) (PProDOT-(Me)$_2$ as the active EC polymer. PProDOT-(Me)$_2$ can be electrochemically polymerized on a gold/membrane electrode as the working electrode layer 430 and on a gold coated non-porous plastic substrate 405/402 as the ion storage layer 410. ECD 400 is shown including an optional transparent protecting plastic window 450 to shield working electrode layer 430 from the environment.

The working electrode 430, such as PProDOT-(Me)$_2$, on the front-side metal layer 425 top electrode is in its neutral (colored) state as assembled. In operation, a computer driven power supply 440 applies a DC bias between counter electrode layer 410 (through Au layer 405) and working electrode layer 430 through back-side traces 418, through substrate 420 to electrode comprising front-side layer 425.

Under the bias arrangement shown in FIG. 4(a) the working electrode 430 is in its neutral (colored) state. As shown in FIG. 4(b), when a positive voltage, such as +1.0V is applied between the working electrode 430 through back-side contact 418 and the counter electrode 410, the working electrode material, such as PProDOT-(Me)$_2$, is oxidized and doping anions (shown as A-) move upwards from the electrolyte 415 through the ion permeable membrane 420 in order to balance the working electrode polymer's positive charge resulting from its oxidation.

Back-side contact according to the invention permits increased density and more design flexibility as compared to conventional front-side contact techniques. Porous metallized substrate-based devices can provide a significant performance improvement over conventional non-porous substrates. For example, porous metallized substrates have been found to significantly reduce the switching time of ECD devices as compared to conventional device arrangements which utilize non-porous substrates. During the redox process the charge carrying ions can easily access a large number of electroactive sites on the polymer chains due to the additional transport routes provided by the substrate pores. In addition, more stable devices are expected because the electrical current requirement will also generally be reduced as demonstrated in the examples because porous substrate based device according to the invention require substantially less power to switch from one redox state to another as compared to the conventional slitted ECDs.

Any device in which it is desired to have a series of patterned electrodes on one substrate surface and contacts on the back substrate surface can benefit from the invention. These devices include electrochromic display devices as noted above, alphanumeric displays, electroluminescent devices, thin film transistors, photovoltaic devices, and other vertically integrated electronic devices.

Applied to thin film transistors, in one embodiment a field-effect transistor is made of a semiconducting polymer, while the source, drain and gate electrodes can be made of another polymer, the other polymer being electrically conductive. The respective electrodes are all contacted from the back of a porous substrate using a method according to the invention.

Field-effect transistors can be formed using the invention, such as by a process comprising inkjet printing. Electrode contacts on the front of the porous substrate and electrical traces on the back of the substrate can be first printed on a porous substrate for later contact to the source, drain and gate to be formed. For example, a MVD process with shadow masks can be used. The source and drain electrodes can be formed from droplets of a conducting polymer, such as polyethylenedioxythiophene (PEDOT), sprayed by a inkjet printer. A semiconducting, polymer is laid down over the source and drain electrodes, followed by a layer of electrically insulating polymer, such as polyvinyl pyrrolidone (PVP). A gate electrode is then printed on the electrically insulating polymer layer spanning the channel length between the source and the drain, plus some overlap. A voltage on the gate induces charges in the semiconducting polymer and allows current to flow from the source to drain. Although described in terms of a semiconducting polymer, other semiconducting materials can be used with the invention to form thin film transistors.

Many other devices and device combinations are possible using the invention. Some simplified exemplary devices based on the invention are described below.

Figure 5:
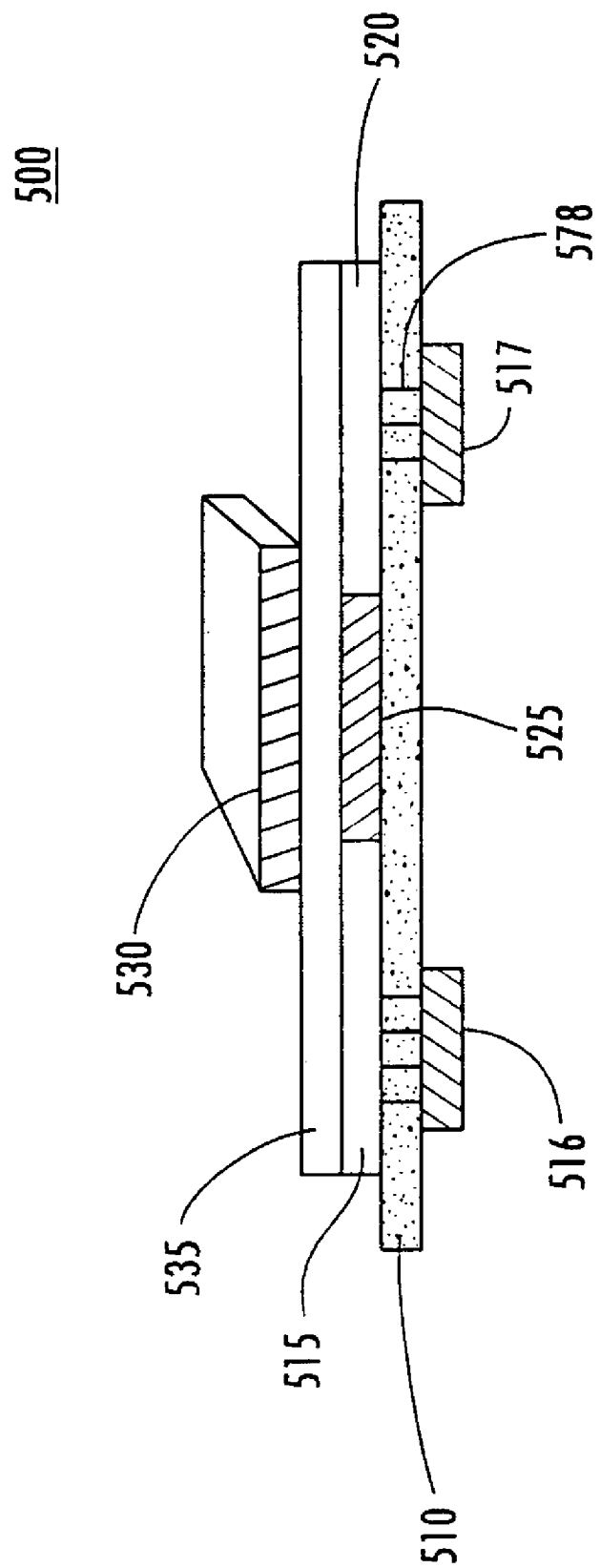
FIG. 5 shows a field effect transistor (FET) built on a porous substrate having its source and drain biased from the back-side of the porous substrate.

FIG. 5 shows a field effect transistor (FET) 500 built on a porous substrate 510 having its source 515 and drain 520 biased from the back-side of porous substrate 510. Conducting channels 518 which span the thickness of the substrate 510 provide electrical contact to source 515 and drain 520 using back-side contacts 516 and 517, respectively.

A semiconducting material 525 is disposed between source 515 from drain 520. A dielectric layer 535 is disposed on semiconductor layer 525. A gate electrode layer 530 is disposed on the dielectric layer 535. In operation, a bias is applied between gate 530 and source 515 produces an electrical field in semiconducting layer sufficient to induce a conducting channel to be created. The conducting channel in semiconducting layer 525 channel permits current to flow between source 515 and drain 520 upon application of a bias voltage between source 515 and drain 520.

Figure 6:
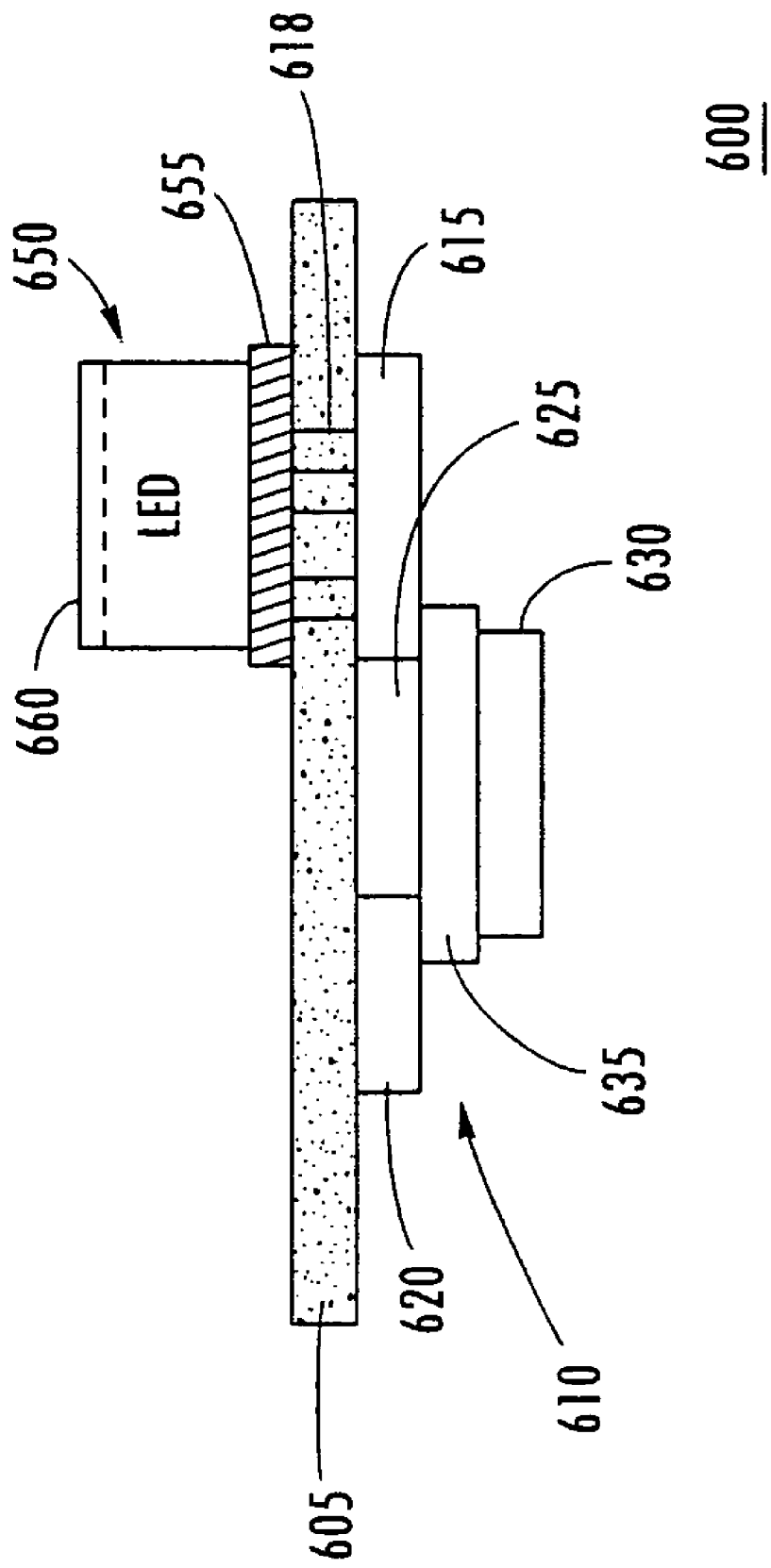
FIG. 6 shows a device including an LED powered by a FET switch based on a porous substrate with back-side contact according to the invention.

FIG. 6 shows a mixed device 600 including an LED 650 powered by a FET switch 610, based on a porous substrate with back-side contact according to the invention. FET 610 is analogous to FET 500 shown in FIG. 5 and is formed using porous substrate 605. A dielectric, layer 635 is disposed on semiconductor layer 625, the semiconductor layer disposed on substrate 605. Drain 615 of FET 610 is electrically connected to metal trace 655 on substrate 605 through conductive channels 618. LED 650 is disposed on metal trace 655 and includes optically transparent top electrode 660 (e.g. indium tin oxide glass). Although not shown in FIG. 6, LED 650 can be a polymer light emitting diode (PLED) including a light emitting conjugated polymeric active layer (not shown). In normal operation of device 600, an appropriate voltage between gate 630 and source 620 switches FET 610 on and permits a bias applied between source 620 and the top electrode layer 660 to be imposed across LED 650, which in response emits light.

Figure 7:
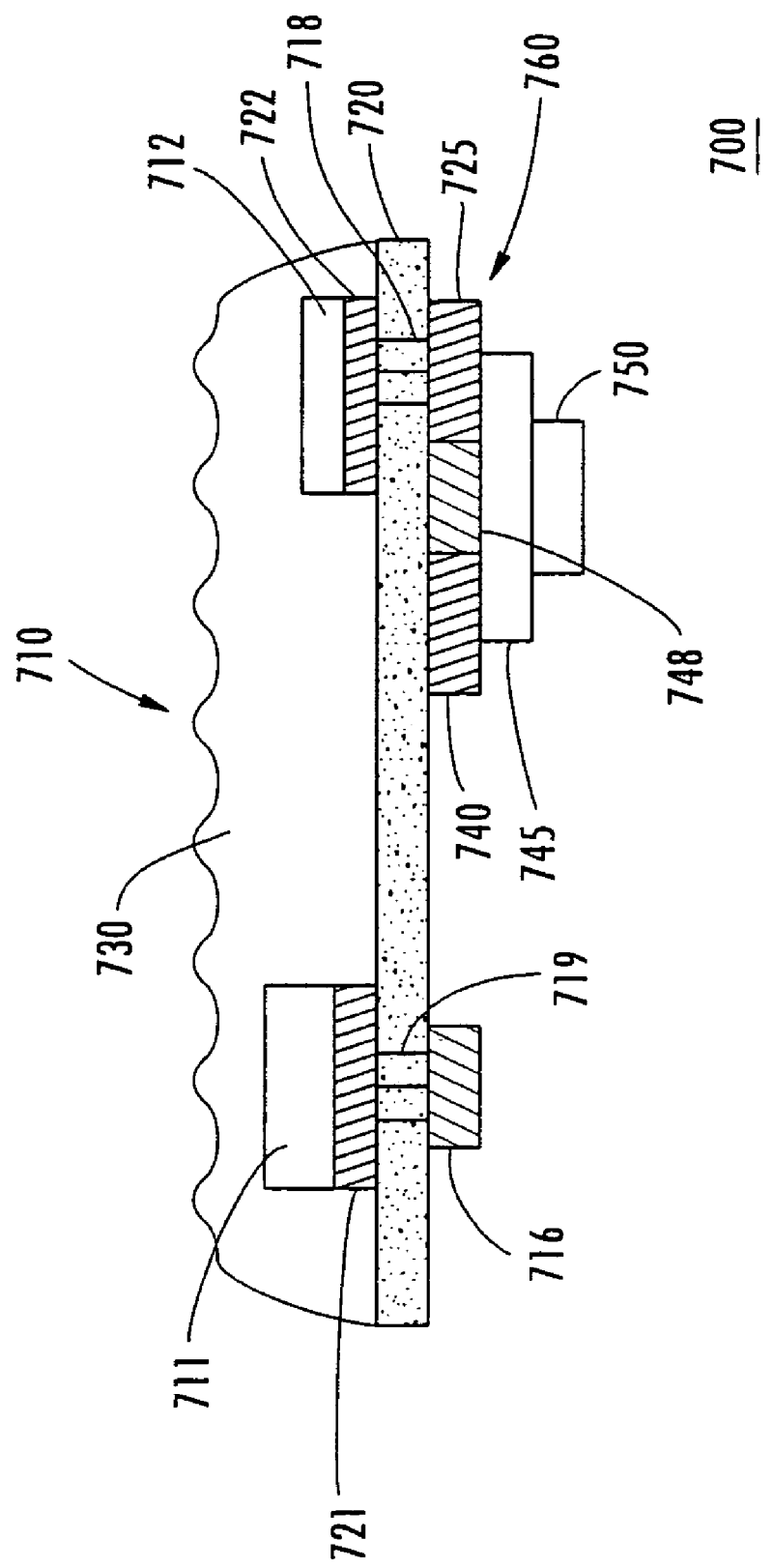
FIG. 7 shows a device comprising a lateral electrochromic device (ECD) including a FET switch based on a porous substrate with back-side contact according to the invention.

FIG. 7 shows a mixed device 700 comprising a lateral electrochromic device (ECD) 710 and a FET switch 760, based on a porous substrate with back-side contact according to the invention. ECD 710 includes pixels 711 and 712, which generally comprise electrochromically active materials, and optically transparent electrolyte layer 730 which covers pixels 711 and 712. Metal contact layers 721 and 722 are disposed beneath pixels 721 and 712, respectively. A FET 760 including a dielectric layer 745 is disposed on semiconductor layer 748, the semiconductor layer 748 disposed on substrate 720, opposite pixel 712. The drain 725 of FET 760 is connected to pixel 712 by channel 718 which extends through substrate 720 to metal contact 722. Pixel 711 is also contacted from the back-side of substrate 720 by channels 719 which connect electrode 721 to metal contact 716. In normal operation, an appropriate voltage between gate 750 and source 740 turns on FET 760, which permits a bias applied between pixels 711 and 712, thus allowing electrochemical reactions to occur.

EXAMPLES

The present invention is further illustrated by the following specific simulation Examples, which should not be construed as limiting the scope or content of the invention in any way.

The Examples below relate to an exemplary application of the invention to ECDs. The ECDs comprise electrochromic polymer(s) which cover a reflective gold surface mounted onto a uniformly porous substrate using patterning techniques. Following a layer-by-layer configuration, the electro-active platforms were paired to a polymeric counter-electrode in order to assemble reflective ECDs. Alkylenedioxythiophenes-based polymers are described on porous architectures with back side contact according to the invention to build fast switchable and highly stable ECDs which require a very low energy to maintain a reflective or absorptive property.

Propylene carbonate (PC) and acetonitrile (ACN) were purchased from Aldrich, distilled and dried before use. $LiClO_4$ (99%, purity) was purchased from Fluka and used without further purification. 3,4-ethylenedioxythiophene (EDOT) was obtained from Agfa Gaevert. 3,4-propylenedioxythiophene (ProDOT), its dimethyl derivative (ProDOT-Me$_2$), and 1,4-bisEDOT-2,5-didodecyloxybenzene (BEDOT-B) were synthesized according to published literature.

In order to demonstrate devices according to the invention including back electrical contacts through a porous substrate, a numeric display electrochromic device was designed and assembled. An ion track etched polycarbonate membrane was used as the porous substrate material (uniform approximately 10 μm pore diameters). The front side of the membrane was covered with gold through the mask shown in FIG. 1(a) using a high vacuum metal vapor deposition process. During the metallization process, the membrane was sandwiched between a clean piece of copper coated epoxy and the shutter mask allowing the patterning of the membrane surface. Seven electrically independent gold pixels were produced. Gold electrical contacts were then deposited on the back of these pixels using the mask shown in FIG. 1(b).

The electrochromic polymer PProDOT-(Me)$_2$ was electrochemically deposited on the pixels with 30 mC/cm$^2$ charge density on each pixel to obtain the highest contrast between the colored and the bleached state of the polymer. A three-electrode cell was utilized to deposit the polymer from a 0.01M monomer electrolyte solution with the gold coated pixels being the working electrode, a platinum flag as the counter electrode and a silver wire as the pseudo-reference. PProDOT-(Me)$_2$ was also deposited on a gold coated Kapton™ substrate to prepare the counter electrode.

Figure 4:
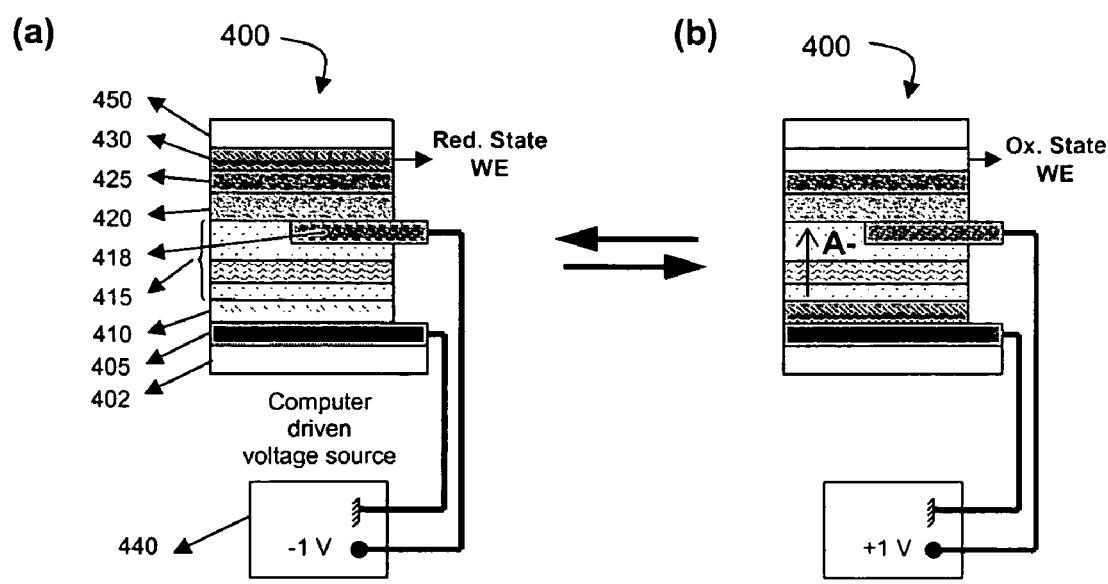
FIGS. 4(a) and (b) show an electrochromic device schematic which includes a porous metallized substrate having conductive traces on the back-side of the porous substrate through which front-side working electrodes are contacted, in its reduced (colored) and oxidized (transparent) states, respectively.

The numeric display ECD was assembled to form the ECD structure shown in FIG. 4. The counter electrode was first placed as the bottom layer, with the polymer coated side facing up. A laboratory filter paper was then placed and a thin layer of gel electrolyte was homogenously applied. The patterned membrane was then placed on the top, the front side (pixels) facing up. Finally, an optically transparent plastic was used to cover the device to prevent the gel electrolyte from drying. The device was then connected to a voltage output through the back-side contacts where each pixel's voltage is controlled separately by a computer program through a D/A converter interface. The counter electrode was shared for all the active pixels and was grounded.

Figure 8:
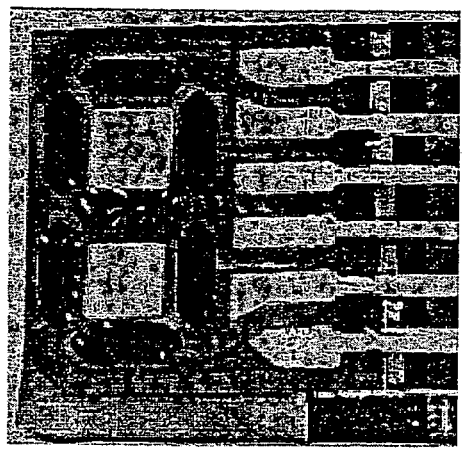
Figure 8:
Figure 8:
Figure 8:
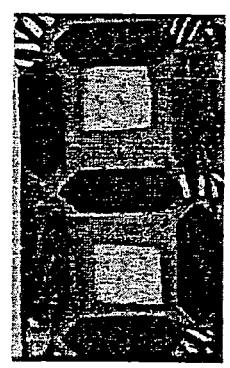
Figure 8:
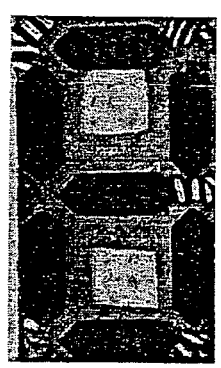

FIG. 8(a) shows a photograph of a numerical display ECD shown along with its back-side contacts. Pixels are independently addressed and their contacts to the voltage source were all made using back-side contacts. The high color contrast achieved is because of the difference in absorptivity of the gold surface and the electrochromic polymer layer.

When a negative voltage (e.g. −1V) is applied to a pixel, the polymer is in its neutral state and it appears blue as this polymer is cathodically coloring. When a positive voltage (e.g +1V) is applied, the polymer switches to its bleached state, therefore the pixel shows the gold. layer beneath the polymer layer. The device shows a high reflectance contrast of $\Delta\% R = 63\%$ in the visible region and a very high reflectance contrast of $\Delta\% R = 74\%$ in the NIR region. The device can be switched over 100,000 times with less than 15% contrast loss. FIGS. 8(b)-(e) show numerical display ECD benefiting from the high contrast of PProDOT-(Me)$_2$ on gold. Specifically, FIG. 8(b)-(e) show the numbers: "2", "4", "5", and "8", respectively.

Results of other experiments are provided below using a porous substrate. Although the devices tested below did not include back-side contact according to the invention, performance results presented are expected to be virtually identical as compared to devices having back-side contact according to the invention since the added series resistance from back-side contact is generally a fraction of an ohm, such as $10^{-4}$ ohms.

A three-electrode cell containing a gold-coated porous membrane as the working electrode, a platinum flag as the counter electrode, and a silver wire as the pseudo-reference electrode was used for electrodeposition of electroactive polymer films via potentiostatic or potentiodynamic methods. All electrochemistry was performed using an EG&G 273A potentiostat/galvanostat. PXDOT films were deposited at 1.2V vs. Ag/Ag+ from a 0.01M monomer in 0.1M LiClO$_4$/PC electrolyte solutions. ECD 400 shown in FIG. 4 was formed by the process described below.

Gold (99.99%) was deposited on the porous substrates (polycarbonate, 10 μm pore size, Osmonics, Inc.) 420 using a high vacuum chamber thermal evaporator (Denton DV-502A). During the metallization process, the porous substrate (5×5 cm) 420 was sandwiched between a clean piece of glass (5×5 cm) and a shutter mask, such as the mask shown in FIG. 1(a), to pattern one side of the membrane surface at a time. Au contact layer 425 was first formed and then a gold layer including conductive traces and bond pads were formed on the other side of the porous substrate 420. The metallization was carried out under high vacuum ($10^{-6}$ to $10^{-5}$ Torr) at a deposition rate of about 4.0 Angstroms/s. These conditions yielded electrically conducting and shiny Au surfaces with a thickness of about 50 nm, as measured by a DEKTAK 3030 profilometer. Electrical conductivity between gold contact layer 425 and the conductive traces on the back-side of substrate was established.

A gel electrolyte 415 was prepared from an ACN solution containing polymethylmethacrylate and LiClO$_4$. ACN was slowly evaporated under stirring and a few drops of PC were added to the mixture to get viscous and highly conducting (about 3 mS/cm) and transparent gel.

A PProDOT-Me$_2$ film 410 was electrochemically coated onto the counter electrode (CE) consisting in a 1.5×2.0 cm Au-coated Mylar sheet 405 using a deposition charge of about 150 mC in a 0.1M LiClO$_4$/PC electrolyte. The active layer 430 was similarly coated with 100 mC of PEDOT, PProDOT or PProDOT-Me$_2$ on Au contact layer 425. The CE was placed, face-up, onto a transparent plastic substrate and a thin layer of gel electrolyte was homogeneously applied. A few drops of gel electrolyte were also added to the active layer 430 to ensure adequate swelling of the polymer. Finally, an optically transmissive window was placed over the outward facing active electrode to protect the polymer film.

The characterization of the optical properties of devices formed according to the invention was carried out using a UV—VIS—NIR (Cary 500 Varian) mounted to an integration sphere. A blank device with the same construction was used as a reference.

The porous PC substrate has the tendency to roll-up upon drying, and therefore a high boiling point solvent such as propylene carbonate was chosen for the electrochemical depositions of the polymers. Potentiostatic methods, where a constant potential is applied in a three-electrode cell configuration until the desired amount of charge is passed, are the most convenient techniques to electrochemically deposit dioxythiophene based polymers (PXDOTs) onto metallized membranes. However, concerning the deposition process of Poly(BEDOT-B), only multisweep scans between −0.5V and 1.0V vs. Ag/Ag+ yielded a well-adherent polymer film onto the membrane. The metallized substrates have low surface resistivities (about 5 Ω/sq), which minimize the effect of the ohmic drop along the electrode surface. Therefore, the polymers can be easily doped/dedoped under an externally applied potential. In all cases the electrochemical behavior of the EC polymers were found to be stable upon several thousands of switches.

In order to determine a complete performance of the ECDs in term of color contrast, it was necessary to pair a working electrode (WE) active layer with a CE containing more electroactive materials. The electrochemical properties of the CE do not limit the switching speed and optical contrast of the active layer. However; the nature of the polymer deposited onto the CE does affect the kinetic performance, but has no influence on the steady-state properties (such as % R) in the visible-NIR regions. Table 1 below lists the characteristic of the five poly(3,4-alkylene-dioxythiophene) based devices (D1-D5) used in the experiments performed.

TABLE 1

| Device # | Active layer | Counter Electrode | Remark |
|---|---|---|---|
| 1 | PProDOT-Me$_2$ | PEDOT* | Active layer is slitted |
| 2 | PEDOT | PEDOT | Built under O$_2$ atmosphere |
| 3 | PProDOT | PEDOT | Built under O$_2$ atmoshpere |
| 3' | PProDOT | PProDOT | Built under O$_2$ atmosphere |
| 4 | ProDOT-Me$_2$ | PProDOT-Me$_2$ | Built under O$_2$ atmosphere |
| 4' | ProDOT-Me$_2$ | PProDOT-Me$_2$ | Built and sealed under Ar |
| 5 | PEDOT and P(BEDOT-B) | PEDOT | Built under O$_2$ atmosphere |

*coated on gold-Mylar

D1 refers to a conventional slitted device on a non-porous substrate described above. D2, D3 and D4 refer to devices constructed with poly(3,4-ethylenedioxythiophene) (PEDOT), Poly(3,4-propylenedioxythiophene) (PProDOT) and PProDOT-Me$_2$ as active layers, respectively on porous substrates according to the invention. D5 represents the dual-polymer (PEDOT and Poly (BEDOT-B)) reflective devices with 2×2 pixel configurations on a porous substrate according to the invention.

Figure 9:
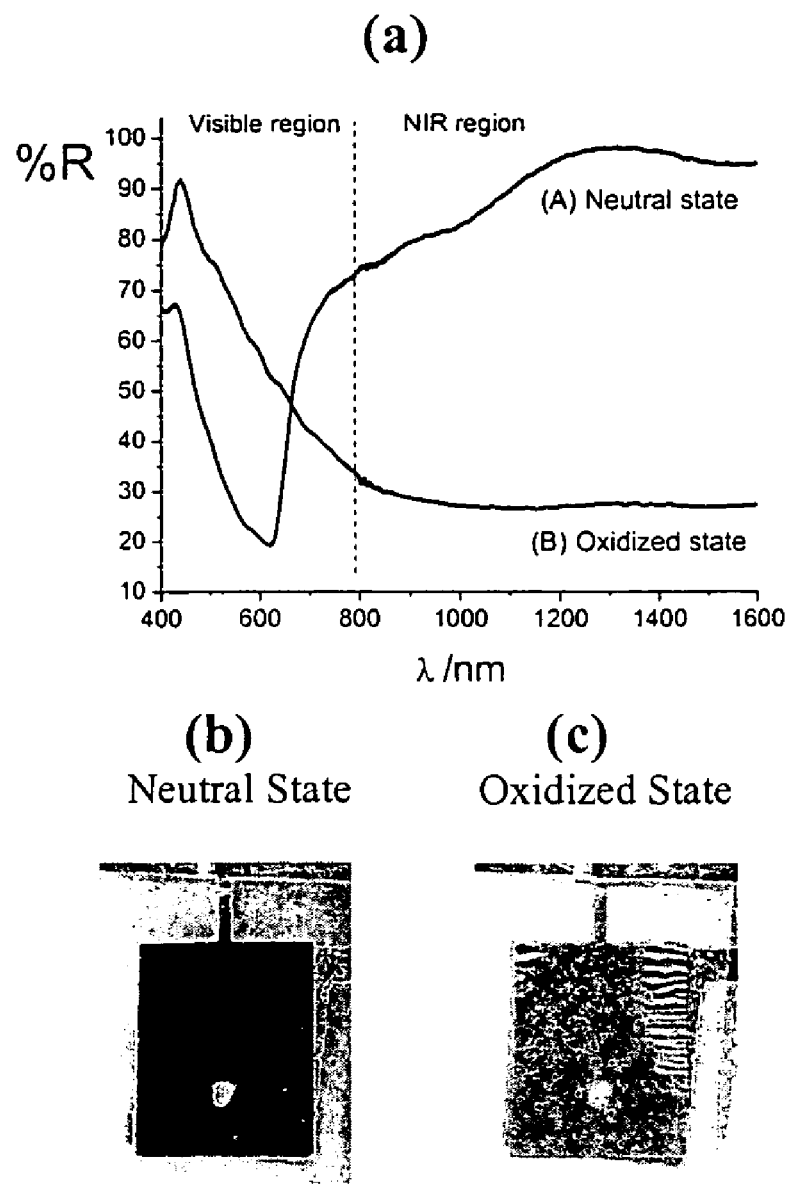

FIG. 9(a) shows the reflectance (% R) of a D3 device according to an embodiment of the invention from the visible region (400-800 nm) to the NIR region (800-1600 nm) in two extreme redox states. FIG. 9(b) is a photograph of the active layer in its fully reduced or neutral state. In the neutral state, the reflectivity is low % RVIS=20% in the visible region. However, the NIR reflectivity is high, as shown by the curve A in FIG. 9(a), with % RNIR=95%. Upon oxidation, the visible reflectivity increases up to % RVIS=70%. The polymer becomes highly transmissive in the visible region and the gold electrode layer is seen, as shown in FIG. 9(c). A concurrent drop in the reflectance through the NIR region is observed, % RNIR=25%. The electrode is visible in both the reduced and the neutral states. In the reduced state, it is colored (e.g. blue) due to the polymer. In the oxidized state, the polymer becomes transmissive, therefore the device turns gold since the gold becomes visible.

Figure 10:
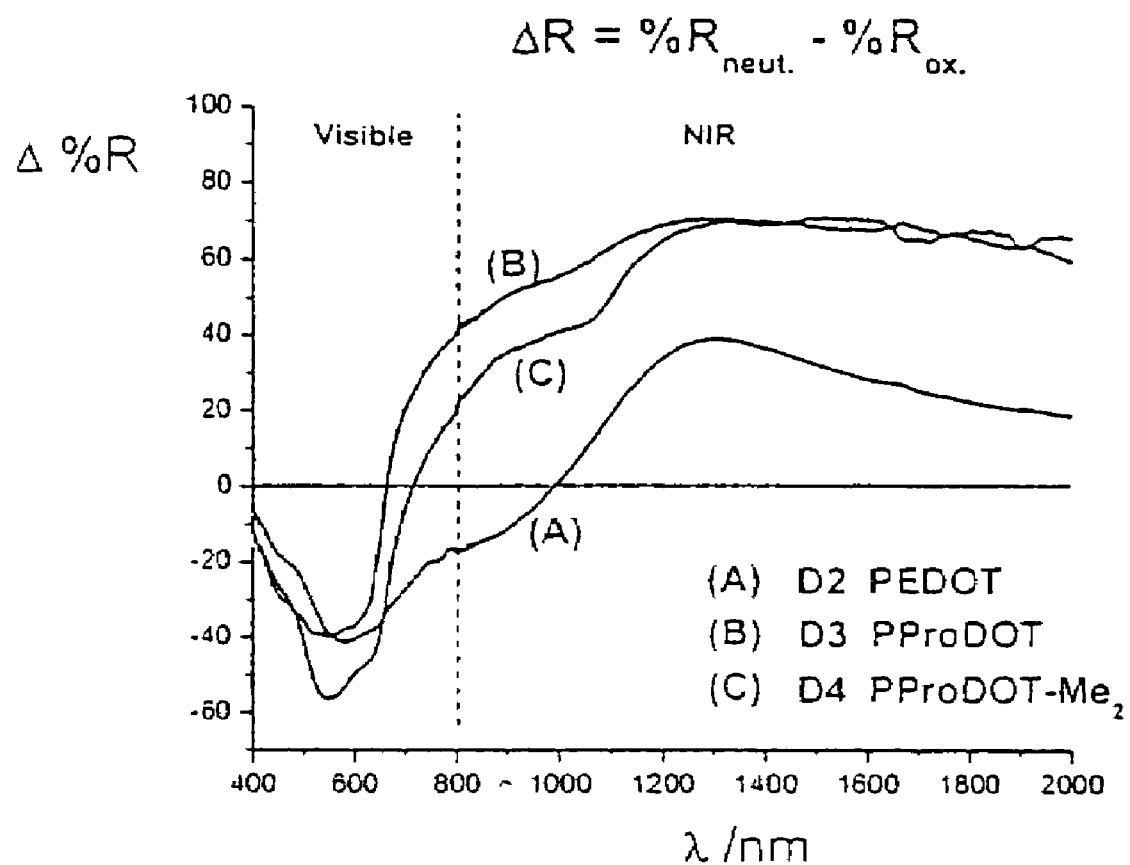
FIG. 10 shows the relative reflectivity contrast for electrochromic devices according to the invention as a function of wavelength through visible and NIR regions.

FIG. 10 shows the relative reflectivity contrast ($\Delta$ % R=% Rneutral−% Roxidized) for D2 (curve A), D3 (curve B) and D4 (curve C) as a function of $\lambda$ through visible and NIR regions. A comparison of these values demonstrates that D3 and D4 have the highest contrast in the NIR ($\Delta$ RNIR=70%) and D4 has the highest contrast in the visible region ($\Delta$RVIS=55%). This may be attributed to a more open morphology induced by the more sterically demanding rings, which allows higher levels of doping and thus higher contrast ratios. As seen in Table 2 below, D1 possesses a higher $\Delta$ % R values in the visible and NIR regions than D4. This may be attributed to the differences in physical characteristics of the Au-Mylar layer (used for D1) and the Au-coated porous substrate (used for D4), such as thickness and total reflectivity.

20% in the NIR region while no reflective contrast is noticed in the visible region ($\Delta$ % $R_{VIS}$=0). The first reflective change in the visible window appears at −0.2V ($\Delta$ % $R_{VIS}$=5%, compared to $\Delta$ % $R_{NIR}$=50%). This particular behavior may be induced by a morphologic evolution of the polymer. Upon oxidation, a morphologic change takes place at the micrometer scale and the corresponding wavelength is more scattered, less reflected.

Figure 11A:
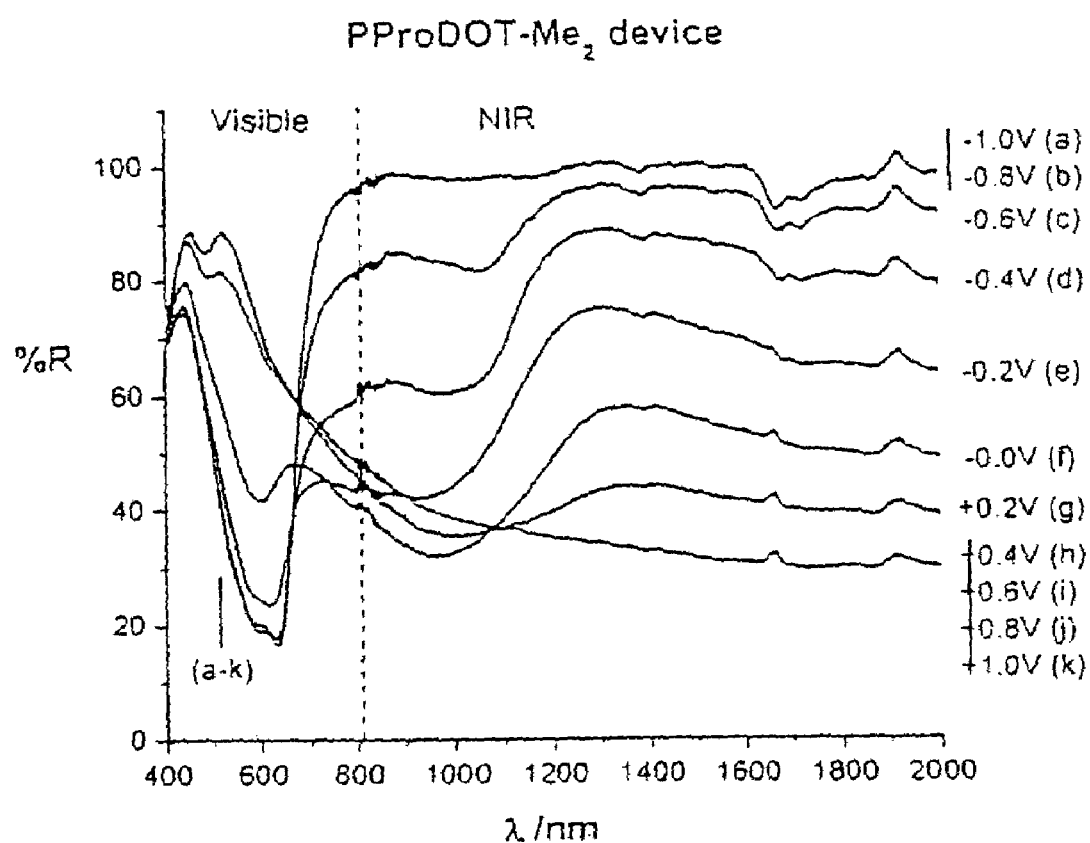
Figure 11B:
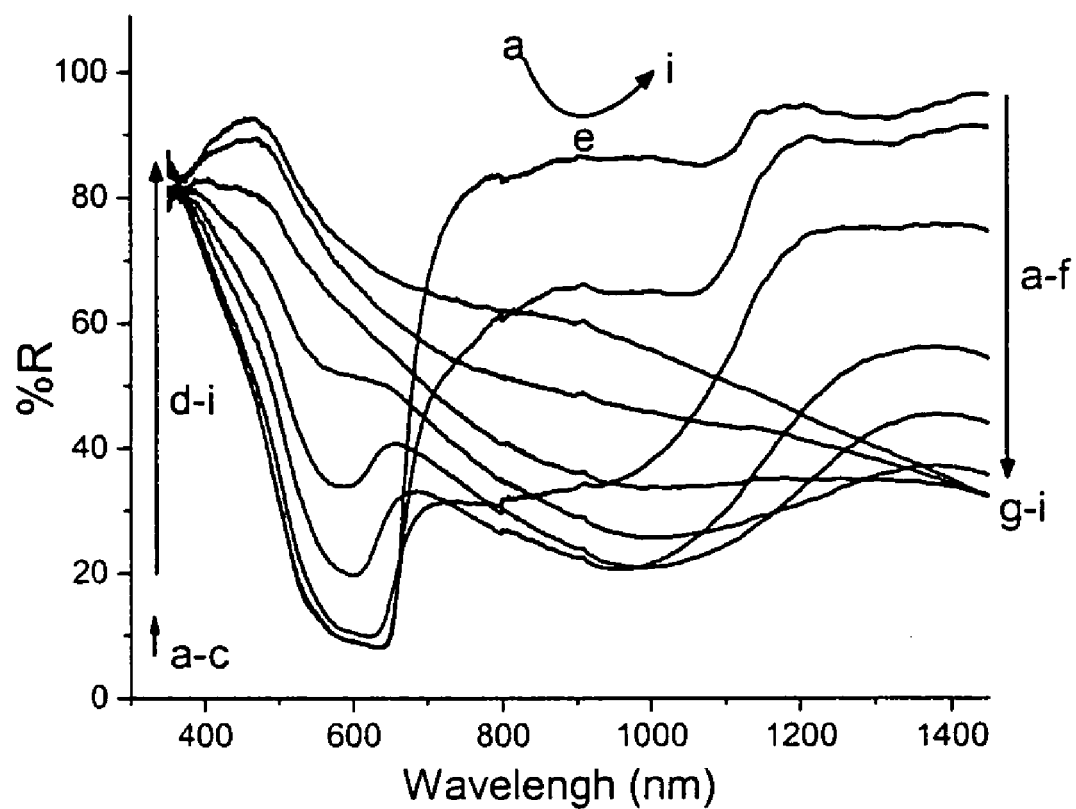
FIG. 11(b) shows in-situ reflectance spectroelectrochemistry of a back-side contacted PProDOT-(Me)$_2$ ECD under applied voltages of (a) −1.0V, (b) −0.8V, (c) −0.6V, (d) −0.2V, (e) 0 V, (f) 0.2V, (g) 0.4V, (h) 0.7V, and (i) 1.0V.

In situ reflectance spectroelectrochemistry was carried out to monitor the optical changes of the top polymer working electrode layer 430 of the dual polymer ECD 400 shown in FIGS. 4(a) and (b). The working electrode 430 switched from −1 V (FIG. 4(a)) to +1 V (FIG. 4(b)) with respect to counter electrode 410. Using an integrating sphere mounted to a UV-Vis-NIR spectrophotometer, a total reflectance spectrum (specular+diffusive) was recorded at each applied voltage as shown in FIG. 11(b). When a negative voltage (e.g. −1.0V) was applied to the device 400, the polymer was in its neutral state and it appeared deep blue as PProDOT-(Me)$_2$ is cathodically coloring. The spectrum at −1.0V (curve a) exhibits a sharp absorption peak at $\lambda$=620 nmM (minimum of % R) corresponding to the $\pi$-$\pi$* transition of the polymer. As the voltage was increased stepwise to +1.0V, the visible absorption decreases and a new absorption band in the NIR region (700-1200 nm) was observed. When fully oxidized, the polymer 430 switched to its bleached state. In this state, gold layer 425 comprising electrodes (not shown) became visible through transparent working electrode 430 and thus fully observable to the eye. The device 400 demonstrated a high reflectance contrast of $\Delta$ % R~60% in the visible region and up to $\Delta$ % R~75% in the NIR region.

In another set of experiments, the use of a porous WE was found to provide a homogeneous color switch over the active layer as opposed to the conventional D1 device which exhibited obvious slits on the electrode. In potential-step experiments performed on D3' shown in FIG. 12(a), the

TABLE 2

| | | Device # | | | | |
|---|---|---|---|---|---|---|
| | | D1 | D2 | D3/D3' | D4/D4' | note |
| VIS contrast | $\Delta$% $R_{VIS}$ | 55% | 40% | 40% | 55% | |
| $\lambda(\Delta R_{max})$ | /nm | 600 | 573 | 534 | 549 | |
| NIR contrast | $\Delta$% $R_{NIR}$ | 80% | 40% | 70% | 70% | |
| $\lambda(\Delta R_{max})$ | /nm | ~1750 | 1265 | 1260 | 1540 | |
| $\eta$ | /cm$^2$ · C$^{-1}$ | * | 259 | 372 | 607 | $\Delta$% R = 95% |
| Time | /ms | * | 1 050 | 400/170 | 100/90 | $\Delta$% R = 95% |
| | | * | 650 | 380/160 | 95/88 | $\Delta$% R = 80%** |

*N/A
**relative to a % R = 10% to % R = 90% contrast

Figure 12:
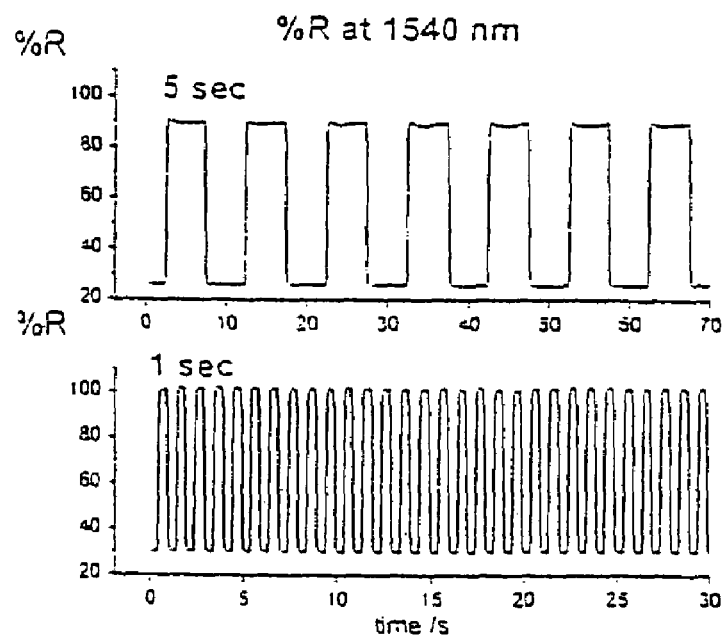
FIG. 12(a) shows results of potential-step experiments performed on ECDs built on a porous substrate (without back-side contact) demonstrating fast and fully reversible optical switching, while FIG. 12(b) provides a dilation of the time axis shown in FIG. 12(a) to provide a more accurate measure of the switching time.
Figure 12:
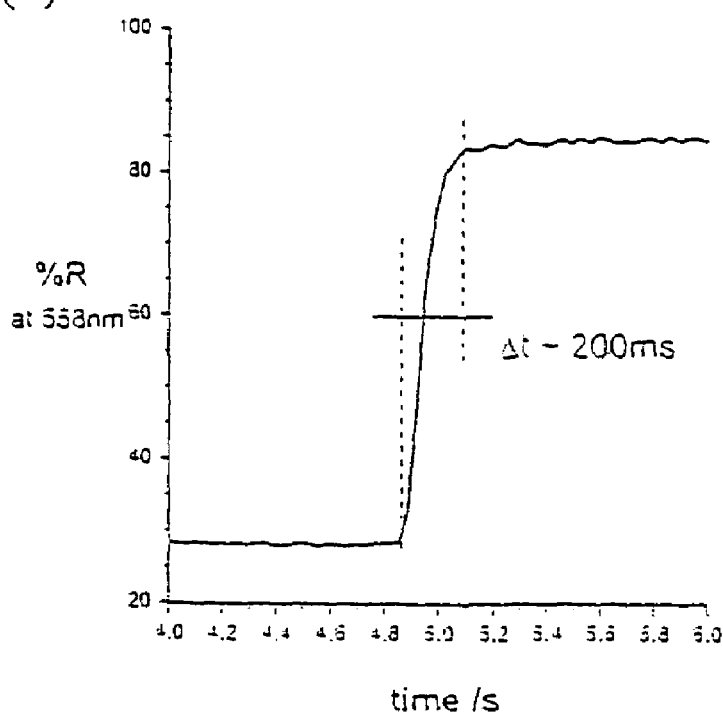

The D4 type device was constructed in a glove box to ensure the absence of any oxygen and water. The spectroelectrochemistry of the device based on PProDOT-Me2, shown FIG. 11(a), exhibits the same optical properties as the device built on the desktop, such as $\Delta$ % $R_{VIS}$=55% and $\Delta$ % $R_{NIR}$=70%. When reduced (curve a), the spectrum exhibits a sharp absorption peak at $\lambda$=620 nm (minimum of % $R_{VIS}$) corresponding to the $\pi$-$\pi$* transition. Upon oxidation, the absorption decreases concurrently with an increase of polaronic (curves d~f) and bipolaronic (curves h~k) transitions in the NIR. The optical behavior is stable, reversible and reproducible upon several switches. However, an unusual behavior was observed in the electrochromic switching properties of the device. At voltages between −1.0V and −0.4V (curves a~d), the change in reflectivity is switching time was set every 5 seconds and 1 second between the neutral and oxidized states. The reflectivity recorded in the NIR (1540 nm) shows the same contrast whatever the switching time. The optical switch was found to be fast and fully reversible. A dilatation of the time axis shown in FIG. 12(b) gives a more accurate measure of the real switching time, about 200 ms, between these two extreme redox states. Table 2 contains the switching time values for the different devices. D3 and D3' differ only by the nature of the polymer coated on CE, PEDOT and PProDOT respectively with switching time around 400 ms and 200 ms. In all cases, the switching times are under half a second, representing the lowest reported values in the case of reflective ECDs. The replacement of the slitted gold-Mylar electrode by a porous metallized substrate thus was found to provide a substantial improvement in the performance of the ECD device.

Figure 13:
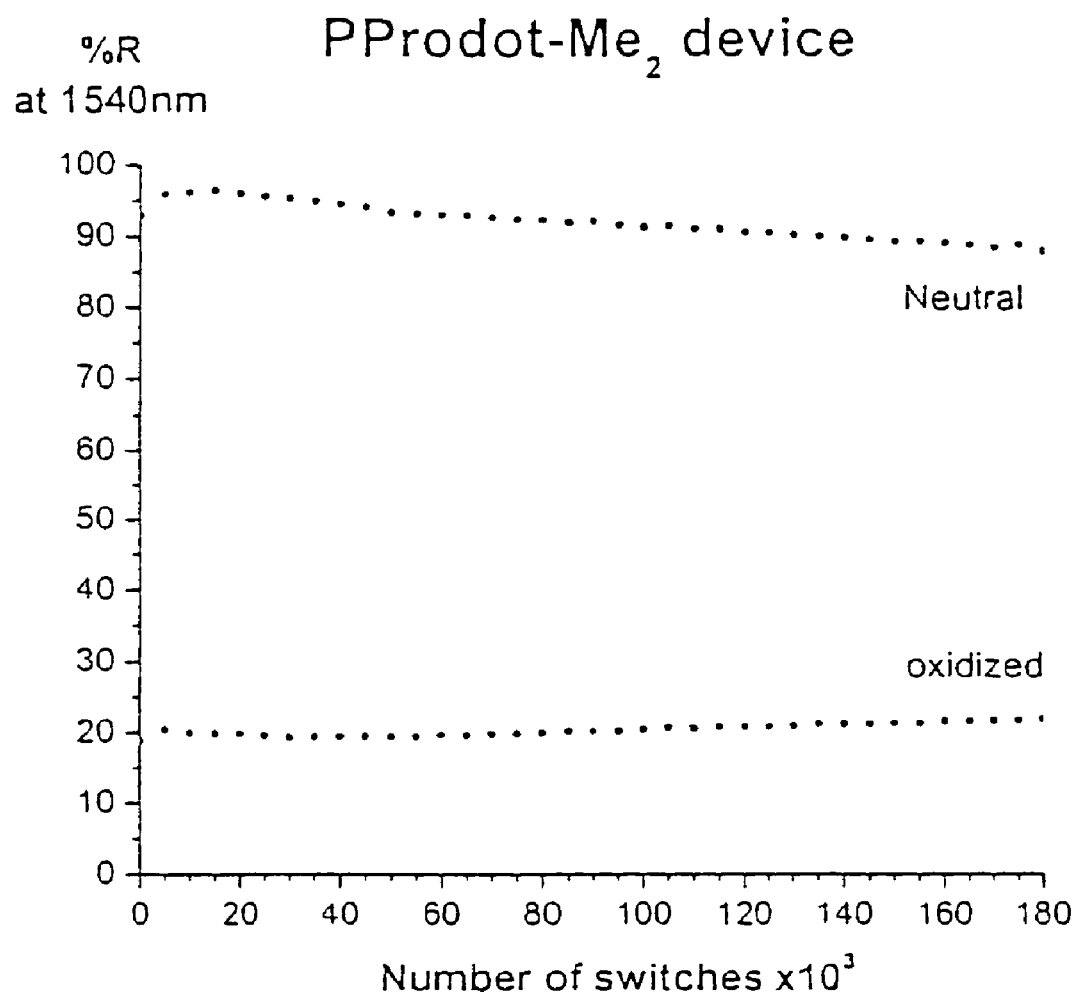
FIG. 13 demonstrates the stability of ECD devices built on a porous substrate (without back-side contact) through 180,000 switches between −1V and +0.9V.

The stability of the device was investigated by switching D4' 180,000 times between −1 V and +1 V every 3 seconds while concurrently monitoring the % R at 1540 nm. The initial contrast of D4' is 75% as shown in FIG. 13. Throughout the experiment, the oxidized form of the active layer is stable with a Δ % $R_{NIR}$=20% and the reflectivity of the neutral formi of the active layer slowly decreases from 95% to 89%. Following the completion of the 180,000 switches, the device was held at a constant voltage for an extended period of time and the initial contrast value was recovered in one minute. This indicates that the decrease in the contrast is due to a decreased switching rate (>3 s). If the device was not sealed (D4), the decrease in reflectance occurs at a faster rate, Δ % R=15% after only 35,000 switches. This provides evidence that the long-term stability of a device is closely connected to the inert conditions. Irreversible oxidation of the polymer in air and slow evaporation of the solvent are the main causes for the rapid decrease of the devices reflectivity in its neutral form, but the oxidized form of the active layer exhibits the same stability for D4 and D4'.

The composite coloration efficiency (CCE) is an efficient and practical tool to measure the power efficiency of a device. It determines the amount of optical density change (ΔOD) induced as a function of the injected/ejected electronic charge ($Q_d$) during a large magnitude potential step, i.e. the amount of charge necessary to produce the optical change in the polymer. This concept has been extensively used in electrochromic materials to compare ECDs containing different materials. ΔOD is directly related to the amount of the electric doping/dedoping charge $Q_d$) by the equation: $\Delta OD = \eta \cdot \Delta Q_d$ where η ($cm^2/C$) is the composite coloration efficiency at a given λ. The Coloration Efficiency experiment consists of a series of potentiostatic steps that are applied from the neutral state (−1 V) to the oxidized state (+1 V), while the charge passing through the cell is measured vs. time with the in situ measurement of the reflectivity. The recorded charge ($Q_{tot}$) is a sum of the polymer redox charge ($Q_d$), the charge necessary to produce the optical transition, and the ohmic drop of the polymer ($Q_{resist}$). The ohmic drop is determined in order to correct the recorded charge. The reflectivity is recorded in the visible region at Δ % $R_{max}$ as shown in FIG. 12(b).

CCE experiments are commonly performed on transmissive type devices, however for this experiment, η values were obtained for the reflective devices. For comparison, the coloration efficiencies (η) calculated for a 95% optical change and the associated switching times are listed in Table 2. The switching time of the poly(3,4-alkylenedioxythiophene) derivatives increases from PEDOT (1.05 s), PProDOT (170 ms), to PProDOT-Me$_2$ (90 ms). In addition to their intrinsic conductivity, their morphology plays an important role in the mobility of the charge carriers during a redox switch. Substituted and hindered dioxythiophene rings offer more open/accessible redox sites that improve the switching speed of the polymer. In addition, the Table 2 includes the Δ % R=10% to 90% switching time values in order to get rid of any hysteresis effect. Starting the experiment from the reduced state, the conductivity of polymers is low and may hinder the beginning of the oxidation process. The coloration efficiency values measured for PEDOT, PProDOT, and PProDOT-Me$_2$ are 259 $cm^2C^{-1}$, 372 $cm^2C^{-1}$, and 604 $cm^2C^{-1}$. PProDOT-Me$_2$ exhibits a 95% full contrast in less than 100 ms in a porous substrate-based device, as shown in FIG. 12(b). In such conditions, the optical kinetics reach the limits allowed by the optical characteristics of the apparatus (one measure every 30 ms). This means that the limitation of the electrochomic performance of the device is not due anymore by the elements constituting the reflective ECD, such as the nature and choice of materials, polyelectrolyte, and assembly step.

Figure 14:
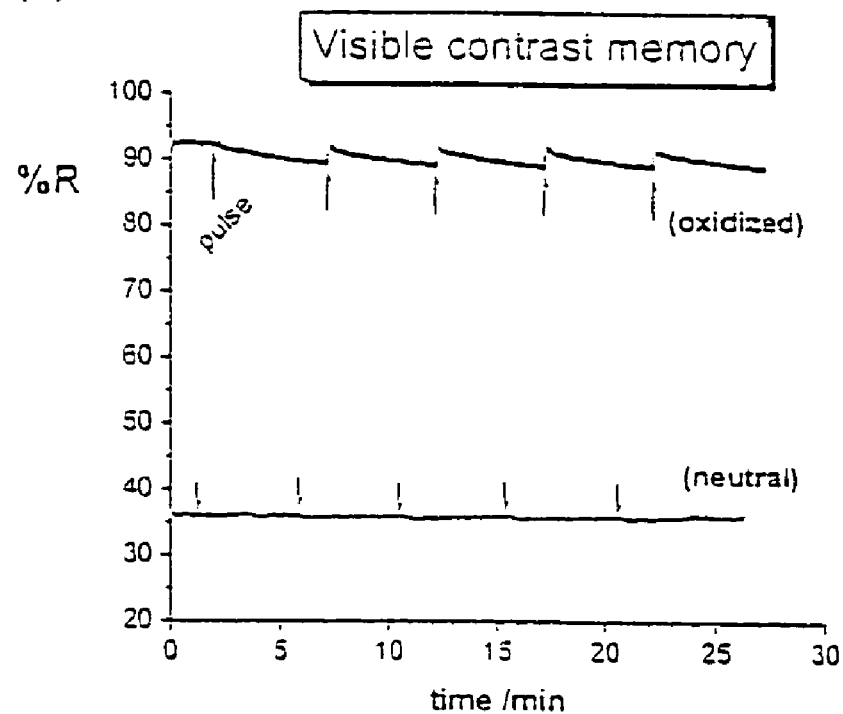
FIGS. 14(a) and 14(b) illustrate the variation of the reflectivity (% R) in the visible and NIR regions, respectively, for both the oxidized and neutral states of the active layer form ECDs built on porous substrates (without back-side contact).
Figure 14:
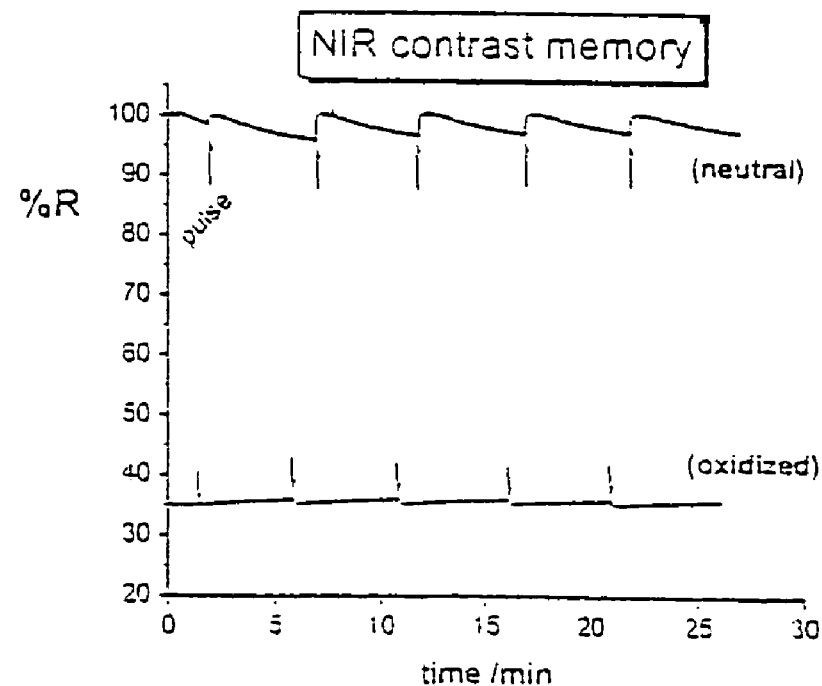

In addition to dynamic stability, passive stability of devices according to the invention were investigated. FIG. 14 illustrates the variation of the reflectivity % R in the visible (a) and NIR (b) regions for both the oxidized and neutral states of the active layer. In this experiment, a pulse (−1V or +1V for 1 second) was cyclically applied followed by a disconnection of the WE (open circuit) for 5 minutes. The % R was recorded as a function of time. Thus, the memory effect was monitored during the disconnection step, which quantified the ability of the device to retain the reflectivity imposed by the pulse. It was observed that the reflectivity of the neutral state was very stable in the visible region FIG. 12(b) and no pulse was needed. The reflectivity of the oxidized state exhibited a δ/δ.t(% $R_{VIS}$)=0.4%. min−1 loss during 5 min (FIG. 7(b)). A short pulse (+1V) is needed to recover the initial % R. This behavior is opposite in the NIR region. A δ/δ.t(% $R_{NIR}$)=1%.min−1 during the open circuit stage is recorded when the device is maintained at its neutral state. However, the reflectivity loss is not significant since the Δ % R is still high (>68%). This reveals that the sealed device can exhibit its full reflective properties with a brief supply of energy. The case of the non-sealed device is similar, but the decrease in NIR reflectivity is higher (δ/δ.t(% $R_{NIR}$)=1%.min−1).

To establish the energy consumption of these devices, the power necessary to switch a porous type ECDs (D4) according to the invention to a conventional slitted type ECD (D1) was compared. Table 3 contains the electrical characteristics of D1 and D4 to calculate the energy (E) per area unit necessary to switch from one redox state to another.

TABLE 3

|  | D1 Slitted-type device | D4 Porous-type device |
| --- | --- | --- |
| ΔV* | 2 V | 2 V |
| Area | 10 $cm^2$ | 3 $cm^2$ |
| Charge, Q | 1.5 $mC/cm^2$ | 0.67 $mC/cm^2$ |
| Power, $P_{max}$ | 0.6 $mW/cm^2$ | 12 $mW/cm^2$ |
| Pulse time, t | 10 sec | 1 sec |
| Energy E | 3 $mJ/cm^2$ | 1.33 $mJ/cm^2$ |

*from −1 V to +1 V
**peak intensity

The energy is given by the following equation E=∫ΔV .i∂t, where ΔV is the pulse (−1V to +1V) applied to switch the device. In this condition, E=ΔV∫i∂t=ΔV .Q(t) with Q(t) being the charge necessary during the pulse. The porous substrate based device (D4) according to the invention clearly required substantially less power to switch as compared to the conventional slitted ECD (D1).

Considering a 1 $m^2$ surface active device (about 600 g/$m^2$) connected to a state-of-the-art Li-battery (400 kJ·$Kg^{-1}$, 111 W·$Kg^{-1}$), D4 will hold 8000 hours (1 year). In addition D1 and D4 will switch 13,000 and 30,000 times, respectively. If switched 500 times a day and then held to one redox state, a 1 Kg battery can operate a D4-type device for 50 days, while only about 21 days for D1.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. An electromagnetically active device, comprising:
    a porous electrically insulating membrane substrate having a plurality of pores;
    at least one frontside electrode disposed on a top-side of said substrate, said frontside electrode being a porous electrode;
    at least one back-side contact trace disposed on the back-side of said substrate, wherein said frontside electrode is electrically coupled to said back-side contact trace by a plurality of electrically conducting channels extending through said pores, wherein at least a portion of the electrically conducting channels are open, and
    an electromagnetically active layer electrically coupled to said frontside electrode.

2. The device of claim 1, wherein at least one of an electrically conductive polymer or a metal disposed as said at least one frontside electrode or said at least one back-side contact trace provides said conducting channels between said frontside electrode and said back-side trace.

3. The device of claim 1, wherein the plurality of electrically conducting channels in said pores are formed from an electrically conducting material not clogging said electrically conducting open channels other than material forming said substrate.

4. The device of claim 1, wherein a thickness of said frontside electrode is less than 60 nm.

5. The device of claim 1, wherein said electromagnetically active device comprises an electrochromic device, wherein said electromagnetically active layer comprises an electrochromically active layer, further comprising an electrochemically active layer and an electrolyte layer having electrolyte disposed between said back-side trace and said electrochemically active layer within unfilled pores and partially filled pores of said substrate, and an electrically conductive contact layer in contact with said electrochemically active layer, said partially filled pores providing said electrically conducting channels of said substrate.

6. The device of claim 5, wherein at least a portion of said plurality of pores of said membrane are at least partially filled by said frontside electrode or said back-side contact trace to produce said electrically conducting channels and allow said electrolyte to travel in said partially filled pores between said electrochromically active layer and said electrochemically active layer.

7. The device of claim 6, wherein said electrochromically active layer comprises a cathodically coloring polymer which provides a band gap (Eg) <or =2.0 eV in its neutral state.

8. The device of claim 7, wherein said cathodically coloring polymer comprises a poly (3,4-alkylenedioxyheterocycle).

9. The device of claim 8, wherein said alkylenedioxyheterocycle comprises at least one selected from the group consisting of an alkylenedioxypyrrole, an alkylenedioxythiophene and an alkylenedioxyfuran.

10. The device of claim 9, wherein said poly (3,4-alkylenedioxyheterocycle comprises bridge-alkyl substituted poly (3,4-alkylenedioxythiophene).

11. The device of claim 10, wherein said bridge-alkyl substituted poly (3,4-alkylenedioxythiophene) is PProDOT-(methyl)$_2$, PProDOT-(hexyl)$_2$, or PProDOT-(ethylhexyl)$_2$.

12. The device of claim 5, wherein said at least one electrode comprises a plurality of electrodes, said electrochromically active layer comprising an anodically coloring polymer.

13. The device of claim 12, wherein said anodically coloring polymer providing a band gap (Eg) >3.0 eV in its neutral state.

14. The device of claim 13, wherein said anodically coloring polymer comprises a poly (3,4-alkylenedioxyheterocycle).

15. The device of claim 14, wherein said comprises at least one selected from the group consisting of an alkylenedioxypyrrole, an alkylenedioxythiophene and an alkylenedioxyfuran.

16. The device of claim 14, wherein said poly (3,4-alkylenedioxyheterocycle) comprises N-alkyl substituted poly (3,4-alkylenedioxypyrrole).

17. The device of claim 16, wherein said N-alkyl substituted poly (3,4-alkylenedioxypyrrole) is N-Pr PProDOP, N-Gly PProDOP or N-propane sulfonated PProDOP (PProDOP-NPrS).

18. The device of claim 5, wherein said electrochromic device switches between an optically clear and a colored state in less than one second.

19. The device of claim 5, further comprising an optically transparent protecting window on said electrochromically active layer.

20. The device of claim 5, wherein said device comprises a plurality of electrically isolated pixels.

21. The device of claim 5, wherein said electrically conducting channels of said partially filled pores are electrically separated from one another by said non-electrically conducting substrate.

22. The device of claim 1, wherein said material forming said plurality of electrically conducting channels is other than materials forming said frontside electrode and said back-side contact trace.

* * * * *

UNITED STATES PATENT AND TRADEMARK OFFICE
CERTIFICATE OF CORRECTION

PATENT NO. : 7,333,257 B2
APPLICATION NO. : 10/992827
DATED : February 19, 2008
INVENTOR(S) : John R. Reynolds et al.

It is certified that error appears in the above-identified patent and that said Letters Patent is hereby corrected as shown below:

Column 2,
Line 1, "referred to the back-side" should read -- referred to as the back-side --.
Lines 25-26, "can comprise can comprise electrochemical" should read -- can comprise electrochemical --.
Line 30, "at least on electrode" should read -- at least one electrode --.

Column 6,
Line 25, "electrodes. 361" should read -- electrodes 361 --.

Column 7,
Line 36, "Bandgap control is an important" should read -- Bandgap control is important --.

Column 8,
Line 43, "substrate based device" should read -- substrate based devices --.

Column 9,
Lines 1-2, "by a inkjet printer" should read -- by an inkjet printer --.
Line 9, "from the source to drain" should read -- from the source to the drain --.
Lines 26-27, "a bias is applied" should read -- a bias applied --.
Line 37, "A dielectric, layer" should read -- A dielectric layer --.

Column 11,
Line 13, "shows the gold. layer" should read -- shows the gold layer --.

Column 13,
Line 55, "PProDOT-Me2" should read -- PProDOT-Me$_2$ --.

Column 14,
Line 25, "in the, NIR region" should read -- in the NIR region --.

Column 15,
Line 10, "neutral formi of the active layer" should read -- neutral form of the active layer --.
Line 33, "dedoping charge Q$_d$)" should read -- dedoping charge (Q$_d$) --.
Line 58, "In addition, the Table 2" should read -- In addition, Table 2 --.

UNITED STATES PATENT AND TRADEMARK OFFICE
CERTIFICATE OF CORRECTION

PATENT NO. : 7,333,257 B2
APPLICATION NO. : 10/992827
DATED : February 19, 2008
INVENTOR(S) : John R. Reynolds et al.

It is certified that error appears in the above-identified patent and that said Letters Patent is hereby corrected as shown below:

Column 16,
Line 3, "electrochomic performance" should read -- electrochromic performance --.

Column 18,
Line 24 claim 15, "wherein said comprises" should read -- wherein said anodically coloring polymer comprises --.

Signed and Sealed this

Seventeenth Day of June, 2008

JON W. DUDAS
*Director of the United States Patent and Trademark Office*